United States Patent [19]
Takemae et al.

[11] 4,451,908
[45] May 29, 1984

[54] ADDRESS BUFFER

[75] Inventors: Yoshihiro Takemae, Yokohama; Shigeki Nozaki; Katsuhiko Kabashima, both of Kawasaki; Seiji Enomoto, Yokohama; Tsutomu Mezawa, Aizuwakamatsu, all of Japan

[73] Assignee: Fujitsu Limited, Kawasaki, Japan

[21] Appl. No.: 354,499

[22] Filed: Mar. 3, 1982

[30] Foreign Application Priority Data

Mar. 5, 1981 [JP] Japan .................................. 56-31750

[51] Int. Cl.$^3$ .......................................... G11C 11/40
[52] U.S. Cl. ..................................... 365/222; 365/189
[58] Field of Search ........................ 365/189, 222, 230

[56] References Cited
U.S. PATENT DOCUMENTS 3,737,879  6/1973  Greene ................................ 365/222

Primary Examiner—Terrell W. Fears
Attorney, Agent, or Firm—Staas & Halsey

[57] ABSTRACT

An address buffer for a dynamic memory includes a flip-flop. The flip-flop is coupled at its one input/output terminal with both a first input circuit and a third input circuit connected in parallel with each other and at its other input/output terminal with a second input circuit. The second input circuit receives a reference voltage and is activated by an external address timing clock during a normal operation mode. The first input circuit is also activated by the external address timing clock, but receives an external address. The third input circuit receives an internal refresh address and is activated by an internal refresh address. The address buffer cooperates with a switcher which produces the internal refresh address timing clock and the external address timing clock, alternatively, by switching a basic timing clock generated by an address drive clock generator.

7 Claims, 7 Drawing Figures

ADDRESS BUFFER

BACKGROUND OF THE INVENTION

The present invention relates to an address buffer of a semiconductor memory circuit and, more particularly, to an address buffer used in a dynamic memory which contains therein an address counter for achieving a refresh operation with respect to the stored data in the memory.

As is well known, a dynamic memory, such as a RAM, needs a refresh operation to prevent the stored data in the memory from fading away. In a typical and conventional dynamic memory, an address for achieving the refresh is sequentially supplied, every time a refresh operation is necessary, from an external address generator located outside the memory. However, lately it has been the tendency to generate such an address inside the memory, so that it is not necessary to prepare and employ the above-mentioned external address generator. Such an internal address generator is called a refresh counter. Accordingly, the memory needs no external refresh address, but merely requires an external instruction to commence each refresh operation. Every time the refresh instruction is supplied to the memory, the internal refresh address is sequentially supplied, one by one to the word lines of the memory.

During each rest term of the refresh operation, the memory cooperates periodically with the peripheral units, such as a central processing unit (CPU). In this case, the memory is accessed not by the internal refresh address, but by an external address supplied from the peripheral unit. Therefore, the memory is accessed by the internal refresh address and the external address, selectively. Either the internal refresh address or the external address is then applied to an address decoder, by way of the address buffer. The present invention refers to the address buffer. Generally, the address buffer has two major functions. The first function is to produce both the address (A) and the inverting address ($\overline{A}$), simultaneously, where address (A) is identical to the supplied internal refresh address or the supplied external address. The second function is to convert the level of the supplied address, such as a TTL level, into the high level address (A, $\overline{A}$), such as the MOS level.

The currently used address buffer cannot perform a high speed operation. The reason for this will be explained in detail hereinafter. Thus, the currently used address buffer does not have a sufficient capability to cope with the very high speed data processing in, for example, a super computer system.

SUMMARY OF THE INVENTION

Therefore, it is an object of the present invention to provide an address buffer having the capability of performing a very high speed operation.

The present invention will be more apparent from the ensuing description with reference to the accompanying drawings.

DESCRIPTION OF THE PREFERRED EMBODIMENT

Figure 1:
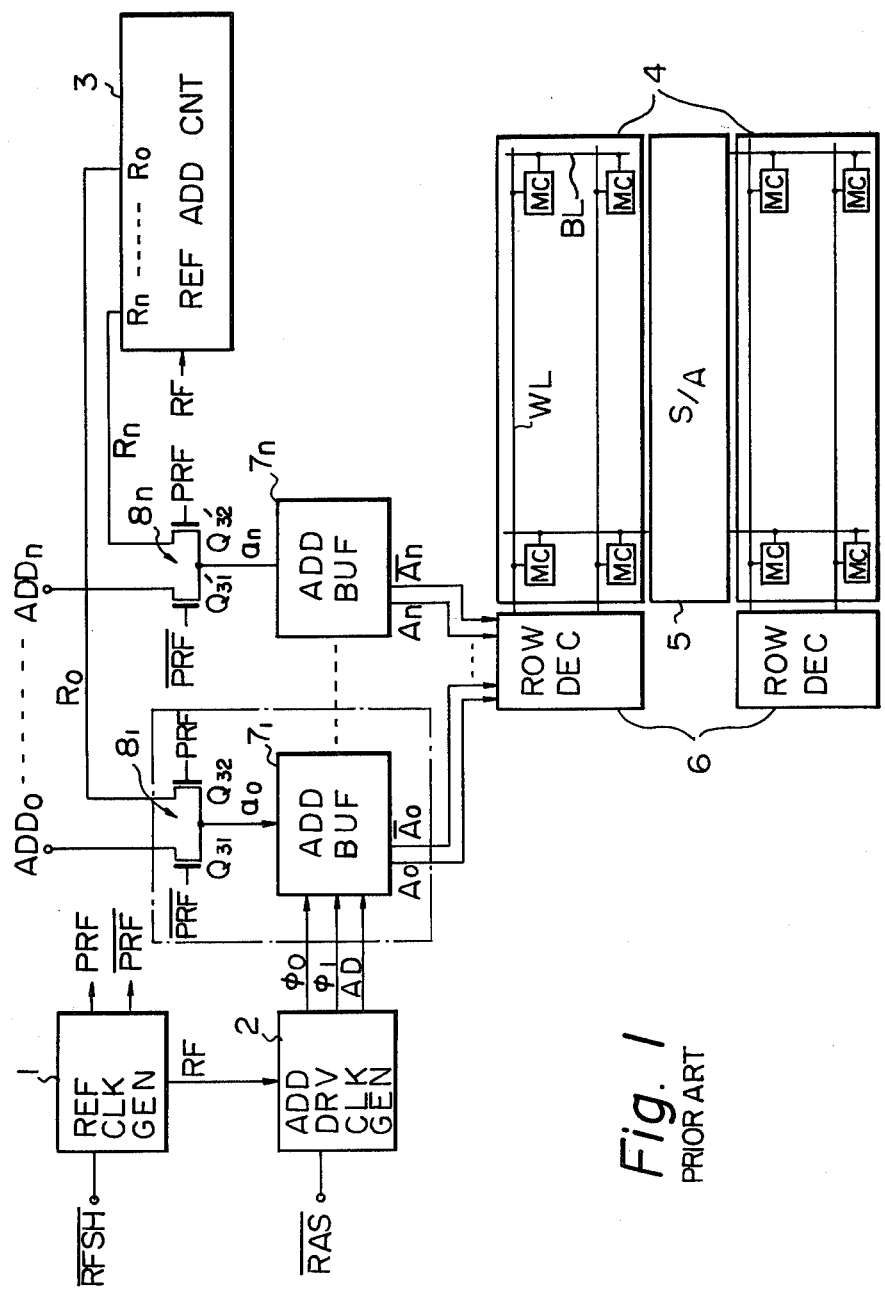
FIG. 1 is a circuit diagram of a dynamic memory which contains a currently used address buffer.

FIG. 1 is a circuit diagram of a dynamic memory which contains therein a currently used address buffer to which the present invention refers. In FIG. 1, the reference numeral 1 represents a refresh clock generator (REF CLK GEN), 2 an address drive clock generator (ADD DRV CLK GEN), 3 an internal refresh address counter (REF ADD CNT), 4 memory cell arrays, 5 a sense amplifier (S/A) including column decoders (not shown) therein, 6 row decoders (ROW DEC), $7_1$ through $7_n$ address buffers (ADD BUF), and $8_1$ through $8_n$ multiplexers. The multiplexers $8_1$ through $8_n$ produce inputs $a_0$ through $a_n$, respectively, to be supplied to the address buffers $7_1$ through $7_n$. The inputs $a_0$ through $a_n$ are specified by either the external address $ADD_0$ through $ADD_n$ during the normal operation mode or the refresh address $R_0$ through $R_n$, which are the output of the internal refresh address counter 3, during the refresh operation mode.

The refresh clock generator 1 receives an external clock $\overline{RFSH}$ and then produces clocks PRF, $\overline{PRF}$ and RF. The clock $\overline{RFSH}$ is logic "L" when the refresh operation is to occur. Therefore, when the clock $\overline{RFSH}$ is logic "H", a normal operation is to occur, which is called a normal operation mode. According to the logic of the clock $\overline{RFSH}$, the logic of the clock PRF or the clock $\overline{PRF}$ becomes "H." When the logic of the clock $\overline{RFSH}$ is "L," the clock PRF is changed to logic "H", and accordingly, the refresh address $R_0$ through $R_n$ is selected as the inputs $a_0$ through $a_n$, via transistors $Q_{32}$ through $Q'_{32}$. However, if the clock $\overline{RFSH}$ is logic "H," the clock $\overline{PRF}$ is made logic "H," and, accordingly, the external address $ADD_0$ through $ADD_n$ is selected as the inputs $a_0$ through $a_n$, via transistors $Q_{31}$ through $Q'_{31}$. The clock RF (also shown in FIGS. 3 and 6A) is used for activating the address drive clock generator 2. The generator 2 receives the clock RF and then produces clocks $\phi_0$, $\phi_1$ and AD, sequentially. The generator 2 is triggered by a trigger pulse $\overline{RAS}$ (row address strobe). The pulse $\overline{RAS}$ is generated synchronously with a machine cycle, and it is used in the normal operation mode.

In the memory cell arrays 4, the reference symbol WL denotes a word line, BL a bit line, and MC a memory cell. A memory cell MC is located at every cross point of the word lines WL and bit lines BL.

Figure 2:
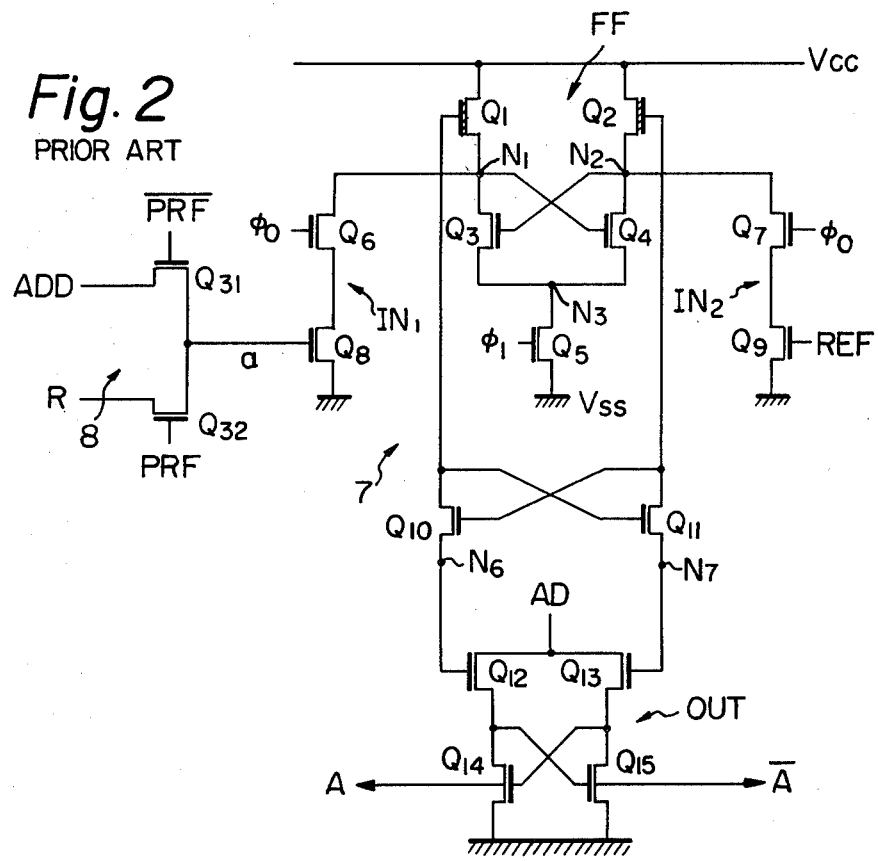
FIG. 2 is a detailed circuit diagram of the address buffer (ADD BUF) and the multiplexer 8 shown in FIG. 1.

FIG. 2 is a detailed circuit diagram of the address buffer (ADD BUF) and the multiplexer 8 shown in FIG. 1. Since, in FIG. 1, the address buffers $7_1$ through $7_n$ have the same construction and also the multiplexers $8_1$ through $8_n$ have the same construction, only one of the address buffers 7 and only one of the multiplexers 8 are illustrated in FIG. 2. The multiplexer 8 receives, at its inputs, the external address ADD and the refresh address R, selectively, and the address buffer 7 produces the addresses A and $\overline{A}$, according to the output of the multiplexer 8. It should be understood that the reference symbols ADD, R, a, A, $\overline{A}$, 7 and 8 are respectively classified into each bit of address by using the suffixes 0 through n.

Figure 3:
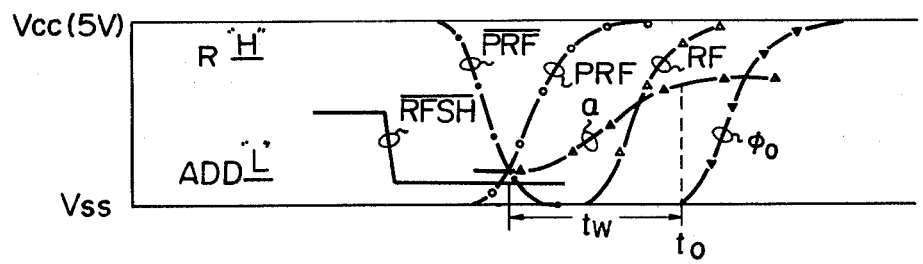
FIG. 3 is a timing diagram used for explaining the operation, especially the refresh operation, of the circuit shown in FIG. 2.

As previously mentioned, in the multiplexer 8, the MOS transistor $Q_{31}$ is controlled at its gate by the clock $\overline{PRF}$, so that if the external clock $\overline{RFSH}$ (FIG. 1) is changed to logic "H", the clock $\overline{PRF}$ is changed to logic "H", and, the external clock ADD becomes effective. On the other hand, the MOS transistor $Q_{32}$ is controlled at its gate by the clock PRF so that if the external clock $\overline{RFSH}$ (FIG. 1) is changed to logic "L", the clock PRF is changed to logic "H", and, the refresh address R supplied from the counter 3 (FIG. 1) becomes effective. Consequently, during the normal operation mode, logical conditions stand, that is $\overline{RFSH}$ is "H" and also $\overline{PRF}$ is "H". In this case, since the MOS transistor $Q_{31}$ is turned to ON, the input a for the address buffer 7 is specified by the external address ADD. However, when the refresh operation mode occurs, the logic of the external clock $\overline{RFSH}$ changes from "H" to "L", as shown in FIG. 3. FIG. 3 is a timing diagram used for explaining the operation, especially the refresh operation, of the circuit shown in FIG. 2. At this time, the output from the reference clock generator 1 (FIG. 1), that is the clock $\overline{PRF}$, changes from logic "H" to logic "L", while the clock PRF changes from logic "L" to Logic "H". Accordingly, the MOS transistor $Q_{32}$ is turned ON and the input a is specified by the refresh address R. The timing diagram of FIG. 3 is depicted by taking, as an example, a case where the refresh address Q has logic "H" and the external address ADD has logic "L".

The address buffer 7 is comprised of MOS transistors $Q_1$ through $Q_{15}$, as shown in FIG. 2. Of these transistors, the MOS transistors $Q_1$ through $Q_5$ comprises a flip-flop FF which functions as a main amplifier. The flip-flop FF includes nodes $N_1$ and $N_2$ which function as a pair of input terminals and a pair of output terminals of the flip-flop FF, alternately. The node $N_1$ is provided with an external address input circuit $IN_1$ which is comprised of the MOS transistors $Q_6$ and $Q_8$ connected in series. The node $N_2$ is provided with a reference voltage input circuit $IN_2$ which is comprised of the MOS transistors $Q_7$ and $Q_9$ connected in series. Further, the nodes $N_1$ and $N_2$ are provided with an output circuit OUT which is comprised of the MOS transistors $Q_{10}$ through $Q_{15}$. The output circuit OUT functions to pick up the amplified signal produced from the flip-flop (main amplifier) FF and produces the addresses A and $\overline{A}$.

The address buffer 7 is started by the application of the clock $\phi_0$. That is, when the clock $\phi_0$ starts rising, as shown by a curve $\phi_0$ in FIG. 3, the MOS transistors $Q_6$ and $Q_8$ are turned ON. In this case, the MOS transistor $Q_9$ is always maintained in a conductive state due to the presence of the reference voltage REF, at its gate. Accordingly, the level at the node $N_2$ is set to a certain level which is determined by the ratio of the mutual conductances $g_m$ between the transistors $Q_2$ (depletion MOS transistor), $Q_7$ and $Q_9$. Generally, the value of the mutual conductance $g_m$ is determined by various factors, such as the size of the MOS transistor and voltage level applied to the gate.

Figure 6A:
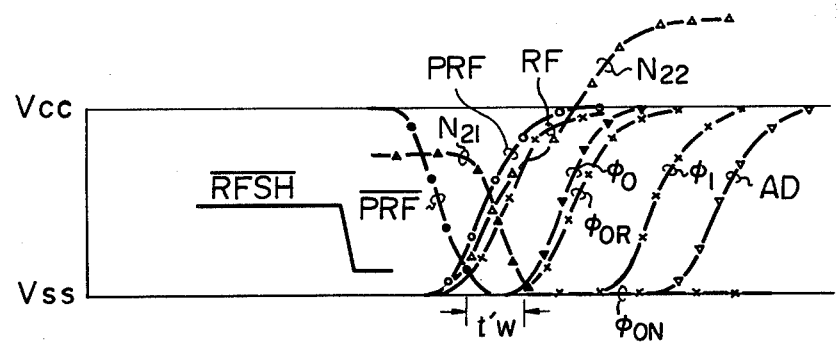
FIG. 6A is a timing diagram used for explaining the operation of the address buffer shown in FIG. 5, during the refresh operation mode.
Figure 6B:
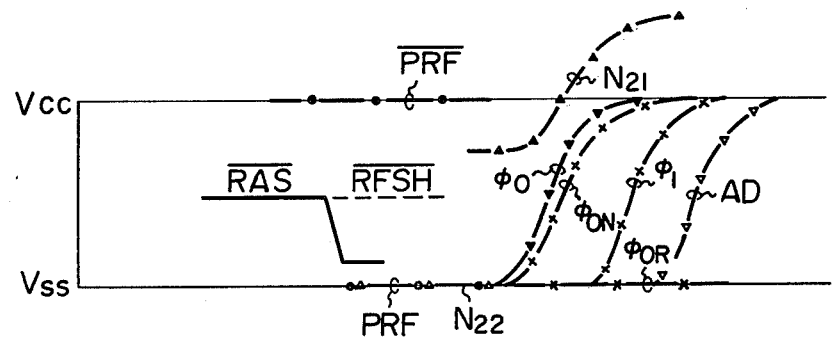
FIG. 6B is a timing diagram used for explaining the operation of the address buffer shown in FIG. 5, during the normal operation mode.

On the other hand, the MOS transistor $Q_8$, with the input a applied to its gate, is turned ON or OFF in accordance with logic "H" or "L" of the input a. When the input a is logic "H", the transistor $Q_8$ is turned ON, and, accordingly, a current flows through the MOS transistors $Q_1$ (depletion MOS transistor), $Q_6$ and $Q_8$. At this time, the voltage level at the node $N_1$ is determined by the ratio of the mutual conductances $g_m$ defined by the respective transistors $Q_1$, $Q_6$ and $Q_8$. In this case, the value of $g_m$ defined by the transistor $Q_8$ is designed in advance to be larger than the value of $g_m$ defined by the aforementioned transistor $Q_9$ receiving the reference voltage REF. As a result, the relationship $V_{N1} < V_{N2}$ is obtained, where the symbols $V_{N1}$ and $V_{N2}$ denote the voltage levels developed at the nodes $N_1$ and $N_2$, respectively. However, if the input a is changed to logic "L", the relationship $V_{N1} > V_{N2}$ is obtained, where the voltage $V_{N1}$ is almost the same as the voltage level $V_{CC}$ (FIGS. 2 and 3). Thus, either the relationship $V_{N1} < V_{N2}$ or the relationship $V_{N1} > V_{N2}$ is created in accordance with the logic "H" or "L", respectively, of the input a. Generally, the difference between the voltages $V_{N1}$ and $V_{N2}$ is very small, and, therefore, the above recited two relationships are not remarkably distinguished from each other. In order to achieve a remarkably distinguished voltages between these two relationships, the voltage levels $V_{N1}$ and $V_{N2}$ are amplified by the aforementioned flip-flop (main amplifier) FF. The flip-flop FF is energized by the clock $\phi_1$ to be applied to the gate of the transistor $Q_5$. The clock $\phi_1$ follows after the clock $\phi_0$, as shown in FIGS. 6A and 6B, but not shown in FIG. 3. When the transistor $Q_5$ is turned ON by the clock $\phi_1$, the voltage level at node $N_3$ is changed to a ground level $V_{SS}$ (FIGS. 2 and 3), wherein node $N_3$ is common to each source of the transistors $Q_3$ and $Q_4$. Thus the flip-flop FF is energized, and if the relationship $V_{N1} < V_{N2}$ stands (a = "H"), the transistor $Q_3$ is turned ON and at the same time the transistor $Q_4$ is turned OFF, the voltage $V_{N1}$ is thus reduced to the voltage level $V_{SS}$. At the same time, the voltage $V_{N2}$ is increased to the voltage level $V_{CC}$. This means that the flip-flop FF has functioned as a voltage amplifier. However, if the relationship $V_{N1} > V_{N2}$ stands (a = "L"), the transistor $Q_3$ is turned OFF and, at the same time the transistor $Q_4$ is turned ON. The voltage $V_{N1}$ is raised to the voltage level $V_{CC}$ and, at the same time, the voltage $V_{N2}$ is decreased to the voltage level $V_{SS}$.

During the term preceding the application of the clock $\phi_0$, a certain state is provided in which the voltage levels at both the nodes $N_6$ and $N_7$ (corresponding to the drains of the transistors $Q_{10}$ and $Q_{11}$, respectively) are precharged to a level of $(V_{CC} - V_{th})$. In this state, the voltage $V_{CC}$ is directly applied to the nodes $N_1$ and $N_2$. Therefore, the transistors $Q_{10}$ and $Q_{11}$ are conductive, so that the nodes $N_6$ and $N_7$ are charged up with certain reduction of the voltage (threshold voltage $V_{th}$ of each of the transistors $Q_{10}$ and $Q_{11}$). However, when the above-mentioned state is changed to the next state, in which the clock $\phi_1$ is activated, since the flip-flop FF is energized, either one of the transistors $Q_{10}$ and $Q_{11}$ is turned OFF in accordance with the logic of the input a. For example, if the logic of the input a is "L", the transistor $Q_{10}$ is turned OFF and, at the same time, the transistor $Q_{11}$ is turned ON, because, in this state, the voltage levels at the nodes $N_1$ and $N_2$ are set to be $V_{N1}$, equal to $V_{CC}$, and $V_{N2}$ nearly equal to $V_{SS}$, respectively; that is, $V_{N1} = V_{CC}$ and $V_{N2} \simeq V_{SS}$. Then, the electric charges stored at the node $N_7$ are absorbed toward the node $N_2$ having the level $V_{SS}$, via the conductive transistor $Q_{11}$. In this state, since the transistor $Q_{10}$ is nonconductive, the electric charges stored at the node $N_6$ remain as they are. Due to the presence of the electric charges at the node $N_6$, the MOS transistor $Q_{12}$ is made fully conductive when the clock AD, having the level of $V_{CC}$, is generated, because the bootstrap effect is effected to the transistor $Q_{12}$ by the above-mentioned electric charges. Then the address $\overline{A}$, having logic "H," is produced. The waveform of the clock AD is not shown in FIG. 3, but is shown in FIGS. 6A and 6B. In this state, since the transistor $Q_{15}$ is turned ON, while the transistors $Q_{13}$ and $Q_{14}$ are turned OFF, the address A is changed to logic "L" being equal to the level of $V_{SS}$. The above-mentioned operation is performed under the condition where the input a has logic "L". Thereby, the address A becomes logic "L", identical to the logic of the input a, while the inverting address $\overline{A}$ becomes logic "H".

If the operation of the circuit shown in FIG. 2 is achieved under the condition where the input a has logic "H", the voltage level $V_{N1}$ is almost the same as the level of $V_{SS}$ and $V_{N2}$ is the same as the level $V_{CC}$. Therefore, the transistor $Q_{10}$ is turned ON, but the transistor $Q_{11}$ is turned OFF. Under such conditions, when the clock AD is generated, the transistors $Q_{13}$ and $Q_{14}$ are turned ON, while the transistors $Q_{12}$ and $Q_{15}$ are turned OFF. As a result, both the address A having logic "H" and the inverted address $\overline{A}$ having logic "L" are produced simultaneously.

During the refresh operation mode, the following operations are executed sequentially in the memory until the production of both the addresses A and $\overline{A}$ are completed: (1) changing of the external clock $\overline{RFSH}\rightarrow$(2) generating the clocks PRF and $\overline{PRF}$ from the refresh clock generator $1\rightarrow$(3) exchanging the external address ADD with the refresh address R under control of the clocks PRF and $\overline{PRF}\rightarrow$(4) generating the clock RF$\rightarrow$(5) generating the clock $\phi_0$ from the address drive clock generator $2\rightarrow$ . . . and so on. In executing the above-mentioned operations, certain defects arise in that it takes a relatively long time from when the above operation (2) is executed to the time when the above operation (5) is executed. In other words, the generation of the clock $\phi_0$ should not be started until the logic level of the input a from the multiplexer 8 is fully saturated to a predetermined level (refer to a time $t_0$ in FIG. 3). Thus, a waiting time should be created in the address buffer 7. With reference to FIG. 3, the waiting time is indicated by the reference symbol $t_w$. This is the reason why the address buffer 7 of FIG. 2 cannot operate with a high speed. To be more specific, the above-mentioned defect is derived from the existence of both the multiplexer 8 and the input circuit IN, shown in FIG. 2, which will be clarified hereinafter.

The present invention intends to improve the operating speed of the memory, specifically to shorten the length of the above-mentioned waiting time $t_w$.

Figure 4:
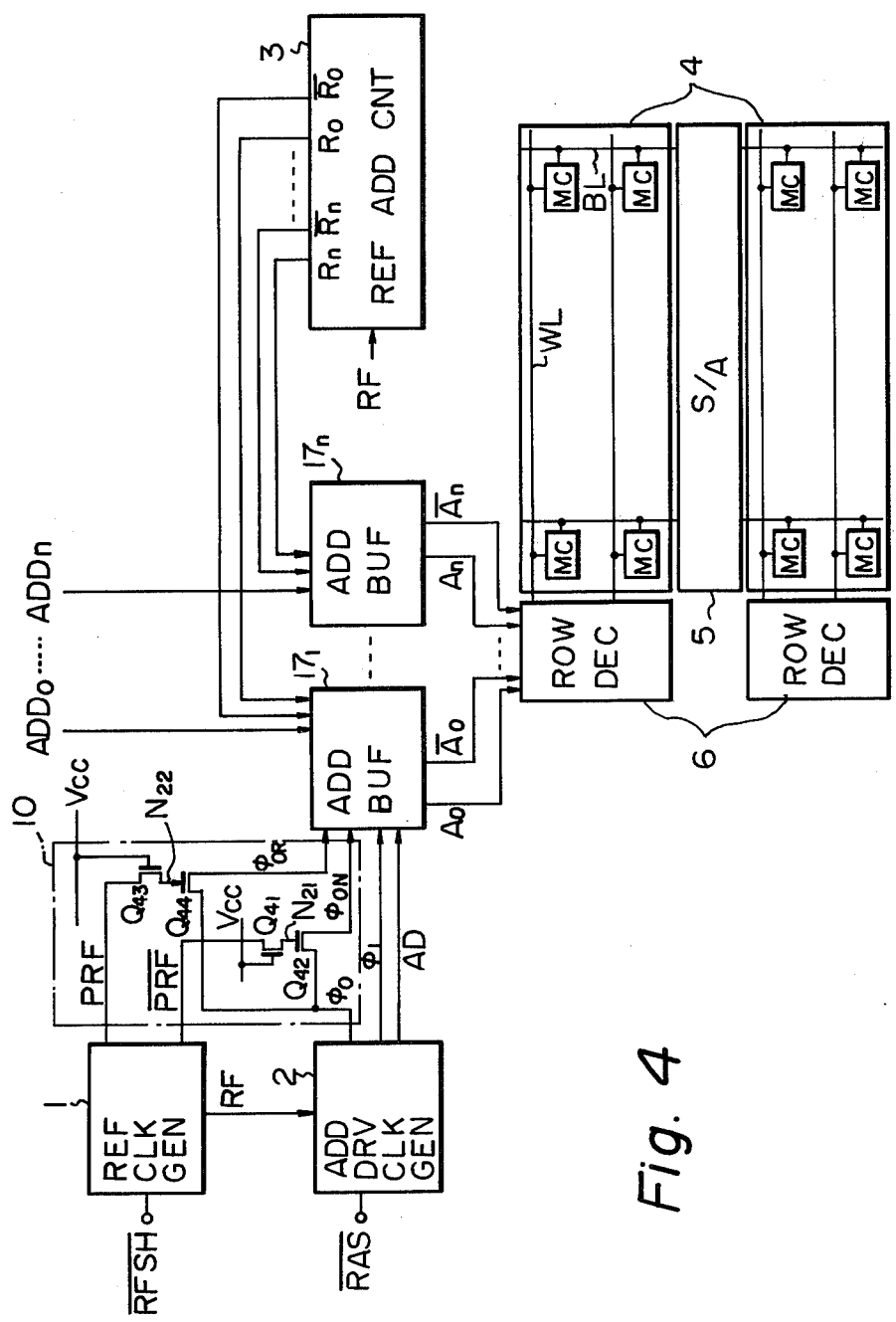
FIG. 4 is a circuit diagram of a dynamic memory which employs an address buffer and its neighboring members according to the present invention.

FIG. 4 illustrates a circuit diagram of a dynamic memory which employs therein an address buffer and its neighboring members according to the present invention. In FIG. 4, members which are identical to those of FIG. 1 are represented by the same reference numerals and symbols. Therefore, members 10 and $17_1$ through $17_n$ are newly employed in the memory of FIG. 4. However, members corresponding to the address buffer (ADD BUF) $17_1$ through $17_n$ are shown in FIG. 1 as the address buffer $7_1$ through $7_n$. The member 10 is called a switcher. During the normal operation mode, the switcher 10 switches the clock $\phi_0$ produced from the address drive generator 2 to a first signal path for transferring a clock $\phi_{ON}$; alternately, the switcher 10 switches the clock $\phi_0$ to a second path for transferring a clock $\phi_{OR}$. In this case, during the normal operation mode, the refresh clock generator 1 produces the clock $\overline{PRF}$ having logic "H", and, accordingly, the logic at node $N_{21}$ is changed to "H", via a MOS transistor $Q_{41}$, with a voltage level equal to ($V_{CC}-V_{th}$). The symbol $V_{th}$ is a threshold voltage of the transistor $Q_{41}$. Then, the clock $\phi_0$ is transferred, as the clock $\phi_{ON}$, from the address drive clock generator 2 to the inputs of the address buffers $17_1$ through $17_n$ via a MOS transistor $Q_{42}$. In this case, it is preferable to maintain the voltage level of the clock $\phi_{ON}$ equal to or higher than that of the source clock $\phi_0$, to strongly drive the address buffers $17_1$ through $17_n$. In order to accomplish this, the MOS transistor $Q_{41}$ is employed. Theoretically, in the switcher 10, the clock $\phi_0$ can be switched to the clock $\phi_{ON}$ or $\phi_{OR}$ by using the gate transistors $Q_{42}$ and $Q_{44}$ controlled directly by the clocks $\overline{PRF}$ and PRF, where the voltage levels of the clocks $\phi_{ON}$ and $\phi_{OR}$ are lower than that of the clock $\phi_0$. However, if the combination of the transistors $Q_{41}$ and $Q_{42}$ and also the combination of the transistors $Q_{43}$ and $Q_{44}$ is introduced into the switcher 10, the bootstrap effect is created in each of these combinations. In this case, the voltage levels at the nodes $N_{21}$ and $N_{22}$ are maintained at a level higher than the level $V_{CC}$.

During the refresh operation mode, the refresh clock generator 1 produces the clock PRF having logic "H", and, accordingly, the MOS transistor $Q_{44}$ is turned ON, so that the clock $\phi_0$ is transferred, as the clock $\phi_{OR}$ to the inputs of the address buffers $17_1$ through $17_n$. Thus, the clock $\phi_{OR}$ and the above-mentioned clock $\phi_{ON}$ are supplied alternatively from the switcher 10. In accordance with the clock $\phi_{ON}$ or $\phi_{OR}$, the external address $ADD_0$ through $ADD_n$, the refresh address $R_0$ through $R_n$ or the inverting address $\overline{R}_0$ through $\overline{R}_n$ are selectively applied to the address buffers $17_1$ through $17_n$.

Figure 5:
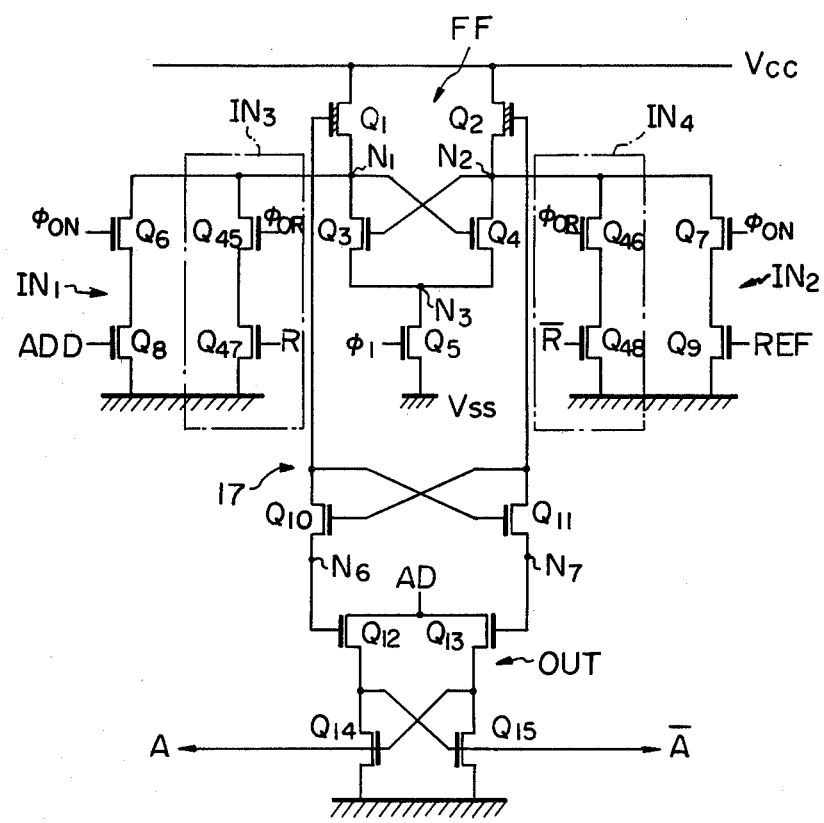
FIG. 5 is a detailed circuit diagram representing the address buffer (ADD BUF) shown in FIG. 4.

FIG. 5 is a detailed circuit diagram of the address buffer (ADD BUF) shown in FIG. 4. This circuit diagram corresponds to that of FIG. 2. Accordingly, members which are identical to those of FIG. 2 are represented by the same reference numerals and symbols. Since, in FIG. 4, the address buffers $17_1$ through $17_n$ have the same construction as each other, only one of them is illustrated, as indicated by the reference numeral 17. In FIG. 5, as compared with the cirucit diagram of FIG. 2, the external address input circuit (first input circuit) $IN_1$ and also the reference voltage input circuit (second input circuit) $IN_2$ are still useful in the address buffer 17. However, the following three points should be noticed. First, the multiplexer 8, which is employed in the address buffer of FIG. 2, is not used therein and no such multiplexer is shown in FIG. 5. The reason for this is that, due to the presence of the multiplexer 8, the voltage level of the input a (FIG. 2) rises very slowly to its saturation level within the aforementioned waiting time $t_w$ (FIG. 3). This is because the mutual conductances $g_m$ of the MOS transistors $Q_{31}$ and $Q_{32}$ comprising the multiplexer 8 prevent the input a level from rising quickly. Second, the input circuits $IN_1$ and $IN_2$ of FIG. 5 do not directly receive the clock $\phi_0$, as in FIG. 2, but receive the clock $\phi_{ON}$ via the switcher 10 (FIG. 4). Third, a third input circuit $IN_3$ and a fourth input circuit IN$_4$ are newly employed. The third input circuit IN$_3$ is connected, as a whole, in parallel with the first input circuit IN$_1$. In addition, the circuit IN$_3$ receives the clock $\phi_{OR}$ and the refresh address R. The fourth input circuit IN$_4$ is connected, as a whole, in parallel with the second input circuit IN$_2$. In addition, the circuit IN$_4$ receives the clock $\phi_{OR}$ and the inverted refresh address $\overline{R}$. In this case, the first and second input circuits IN$_1$ and IN$_2$ are activated by the application of the clock $\phi_{ON}$, while the third and fourth input circuits IN$_3$ and IN$_4$ are activated by the application of the clock $\phi_{OR}$. That is, the MOS transistors Q$_6$ and Q$_7$ of the input circuits IN$_1$ and IN$_2$ are turned ON by the clock $\phi_{ON}$ during the normal operation mode. The third input circuit IN$_3$ is comprised of MOS transistors Q$_{45}$ and Q$_{47}$ connected in series, and MOS transistor Q$_{45}$ is turned ON by the clock $\phi_{OR}$ only during the refresh operation mode. Similarly, the fourth input circuit IN$_4$ is comprised of MOS transistors Q$_{46}$ and Q$_{48}$ connected in series, and MOS transistor Q$_{46}$ is turned ON by the clock $\phi_{OR}$ only during the refresh operation mode.

FIG. 6A is a timing diagram used for explaining the operation of the address buffer shown in FIG. 5, during the refresh operation mode. FIG. 6B is a timing diagram used for explaining the operation of the address buffer shown in FIG. 5, during the normal operation mode. In FIG. 6A, during the refresh operation mode, first the logic of the clock $\overline{RFSH}$ is changed from "H" to "L" and then the logic of the clock PRF is changed from "L" to "H"; at the same time, the logic of the clock $\overline{PRF}$ is changed from "H" to "L" (these clocks PRF and $\overline{PRF}$ are produced from the refresh clock generator 1). These operations are identical to those represented in FIG. 3. However, in FIG. 6A, the clock $\phi_0$ and, accordingly, the clock $\phi_{OR}$ can be generated soon after the logic changes of the clocks PRF and $\overline{PRF}$. In other words, it is not necessary to wait until the time the voltage level of the slow rising input a reaches its saturation level to generate the clock $\phi_0$, as occurs in FIG. 3. As a result, the waiting time t$_w$ of FIG. 3 is considerably shortened to a waiting time t$_w'$ as shown in FIG. 6A, and a high speed operation of the address buffer can be expected. The reason why the input a can be removed from the address buffer 17 is that no member similar to the multiplexer 8 of FIG. 2 is used. Instead of multiplexer 8, the third and fourth input circuits IN$_3$ and IN$_4$ are employed in FIG. 5. Thus, the dynamic memory based on the present invention can operate with a high operating speed as compared to that of FIG. 1.

In FIG. 6A, the characteristic curves N$_{21}$, N$_{22}$, PRF, $\overline{PRF}$, RF and $\overline{RFSH}$ indicate the respective levels appearing in FIG. 4, but not in FIG. 5. Regarding characteristic curves $\phi_0$, RF, PRF, and $\overline{PRF}$, since the clock $\phi_0$ is produced with a certain time delay after the generation of the clock RF, the clocks RF, PRF, and $\overline{PRF}$ may be activated approximately at the same time. Regarding characteristic curve N$_{22}$, the voltage level at the node N$_{22}$ can be increased over the level V$_{CC}$ due to the previously mentioned bootstrap effect.

In FIG. 6B, during the normal operation mode, the logic of the clock $\phi_{ON}$ is changed to "L" and, accordingly, the first and second input circuits are left in an idle state. Thus, a current flows through the third input circuit IN$_3$ or the second input circuit IN$_2$ (also the fourth input circuit IN$_4$). Since the transistor Q$_9$ is always made conductive by the reference voltage REF, the above-mentioned current can flow through the circuit IN$_2$ and also circuit IN$_4$. Consequently, it should be noticed that the fourth input circuit IN$_4$ can be theoretically be omitted from the address buffer 17. However, it is actually preferable to employ not only the third input circuit IN$_3$, but also the fourth input circuit IN$_4$. This is because it is preferable to mount the same load (IN$_3$, IN$_4$) seen from each of the nodes N$_1$ and N$_2$ in view of circuit balance.

Returning again to FIGS. 5 and 6A, the flip-flop FF is liable to be latched in either one of the two states, according to the logic of the refresh addresses R and $\overline{R}$. For example, when the address R is set to logic "H" and, accordingly, the address $\overline{R}$ is "L", the following relationship stands between the voltage levels V$_{N1}$ at the node N$_1$ and V$_{N2}$ at the node N$_2$, that is V$_{N1}$ < V$_{N2}$. Accordingly, the clock $\phi_1$ is applied from the clock generator 2 to the transistor Q$_5$ at its gate and the flip-flop FF is activated so as to make the transistors Q$_3$ and Q$_4$ ON and OFF, respectively. Then, the voltage level V$_{N1}$ is changed to the level V$_{SS}$, while the voltage level V$_{N2}$ is changed to the level V$_{CC}$. As a result, the output circuit OUT produces both the address A of logic "H" and the address $\overline{A}$ of logic L, simultaneously, accessing the memory arrays 4 (FIG. 4).

In FIG. 6B, during the normal operation mode, the clocks $\overline{PRF}$ of logic "H" and PRF of logic "L" are produced from the clock generator 1 (FIG. 4), and, thereby, the clocks $\phi_{ON}$ of logic "H" and $\phi_{OR}$ of logic "L" are generated in the switcher 10 (FIG. 4). Thus, only the first and the second input circuits IN$_1$ and IN$_2$ are activated.

As explained in detail, almost no time for switching the external address ADD to the refresh address R and vice versa is required, and, accordingly, a considerably high speed operating address buffer can be realized.

We claim:

1. An address buffer, for a dynamic memory, having a normal operation mode and a refresh operation mode, the dynamic memory including an address drive clock generator, operatively connected to receive an external address or internal refresh address, for generating a timing clock signal, and a refresh clock generator, operatively connected to the address drive clock generator, for generating an external address timing clock or an internal refresh address timing clock, comprising:
    a flip-flop, having a first input/output terminal operatively connected to receive the external address or the internal refresh address and a second input/output terminal operatively connected to receive a reference voltage, said flip-flop latched in either one of two states in dependence upon the external address or the internal refresh address supplied alternately;
    an output circuit, operatively connected to said flip-flop, providing an output address and an inverted output address;
    a first circuit, operatively connected to said first input/output terminal of said flip-flop and operatively connected to receive the external address and the external address timing clock, for receiving the external address upon receipt of the external address timing clock;
    a switcher, operatively connected to the refresh drive clock generator and the address drive clock generator, for receiving the external address timing clock and the internal refresh timing clock and operatively connected to said first input circuit, for transferring to said first input circuit the external address timing clock during the normal operation mode and the internal refresh address timing clock during the refresh operation mode by switching said timing clock signal of the address drive clock generator;

a second input circuit, operatively connected to said second input/output terminal of said flip-flop, for receiving the reference voltage upon receipt of the external address timing clock; and a third input circuit, operatively connected to receive the internal refresh address clock and the internal refresh address and operatively connected in parallel to said first input circuit, for receiving the internal refresh address upon receipt of the internal refresh address timing clock.

2. An address buffer as set forth in claim 1, further comprising a fourth input circuit, operatively connected in parallel to said second input circuit and operatively connected to receive the internal refresh address timing clock and the internal refresh address, for inverting the internal refresh address upon receipt of the internal refresh address timing clock.

3. An address buffer as set forth in claim 1 or 2, wherein said switcher comprises:
a first gate transistor, operatively connected to the refresh clock generator and operatively connected to receive the external address timing clock, for transferring the external address timing clock; and
a second gate transistor, operatively connected to said refresh clock generator and operatively connected to receive the internal refresh address timing clock, for transferring the internal refresh address timing clock, alternately with that of the external address timing clock of said first transistor.

4. An address buffer as set forth in claim 3, wherein said first gate transistor and said second gate transistor are operatively connected to said third transistor and said fourth transistor, respectively, the combination of said first and third transistors and the combination of said second and fourth transistors creating a bootstrap effect.

5. An address buffer as set forth in claim 1, wherein:
said first input circuit is operatively connected to said flip-flop and operatively connected to receive the external address timing clock and the external address and comprises a first transistor and a second transistor operatively connected in series with said first transistor, said first and second transistors each having a gate operatively connected to receive the external address timing clock and the external address, respectively;
said second input circuit is operatively connected to receive the reference voltage and the external address timing clock and comprises a third transistor and a fourth transistor, operatively connected in series with said third transistor, each having a gate for receiving the external address timing clock and the reference voltage, respectively; and
said third input circuit is operatively connected between said first input circuit and said flip-flop and operatively connected to receive the internal refresh address timing clock and the internal refresh address, and comprises a fifth transistor having a gate for receiving the internal refresh address timing clock and a sixth transistor operatively connected in series with said fifth transistor, having a gate for receiving the internal refresh address.

6. An address buffer as set forth in claim 2, wherein said fourth input circuit is operatively connected between said second input circuit and said flip-flop and comprises a first transistor having a gate and a second transistor having a gate and operatively connected in series with said first transistor, said first and second transistors operatively connected to receive at said gates the internal refresh address timing clock and said inverted internal refresh address, respectively.

7. A dynamic memory comprising:
an address drive clock generator, operatively connected to receive an external address or internal refresh address, for generating a timing clock signal;
a refresh clock generator, operatively connected to said address drive clock generator, for receiving said timing clock signal for generating an external address timing clock or an internal refresh address timing clock;
an address buffer, operatively connected to said address drive clock generator and said refresh clock generator, and operatively connected to receive a reference voltage, said address buffer having a normal operation mode and a refresh operation mode and comprising:
a flip-flop, having a first input/output terminal operatively connected to receive said external address or said internal refresh address and a second input/output terminal, operatively connected to receive the reference voltage, said flip-flop latched in either one of two states in dependence upon the external address or the internal refresh address supplied alternately from said address drive clock generator;
an output circuit, operatively connected to said flip-flop and operatively connected to receive the external address or the internal address, for providing an output address and an inverted output address;
a first input circuit, operatively connected to said first input/output terminal of said flip-flop and said refresh clock generator, and operatively connected to receive the external address upon receipt of said external address timing clock;
a second input circuit, operatively connected to said second input/output terminal of said flip-flop and said refresh clock generator, for receiving the reference voltage upon receipt of said external address timing clock; and
a third input circuit, operatively connected to said refresh clock generator and in parallel to said first input circuit, and operatively connected to receive said internal refresh address, for receiving said internal refresh address upon receipt of said internal refresh address timing clock;
a switcher, operatively connected to said refresh clock generator, said address drive clock generator, and said flip-flop, for receiving said external address timing clock and said internal refresh address timing clock, and for transferring to said first input circuit said external address timing clock during said normal operation mode and said internal refresh address timing clock during said refresh operation mode by switching said timing clock signal supplied by said address drive clock generator.

* * * * *

UNITED STATES PATENT AND TRADEMARK OFFICE
CERTIFICATE OF CORRECTION

PATENT NO. : 4,451,908
DATED : MAY 29, 1984
INVENTOR(S) : YOSHIHIRO TAKEMAE ET AL.

It is certified that error appears in the above-identified patent and that said Letters Patent is hereby corrected as shown below:

FRONT PAGE, [57] line 4, "other" should be --other,--.

Col. 1, line 16, "supplied," should be --supplied--.

Col. 4, line 26, after "distinguished" insert --relationship between these two--; and delete "between these two";
line 27, delete "relationships".

Col. 7, line 41, "$t_w'$" should be --$t'_w$--.

Signed and Sealed this

Second Day of October 1984

[SEAL]

Attest:

GERALD J. MOSSINGHOFF

*Attesting Officer*  *Commissioner of Patents and Trademarks*

UNITED STATES PATENT AND TRADEMARK OFFICE
CERTIFICATE OF CORRECTION

PATENT NO. : 4,451,908
DATED : MAY 29, 1984
INVENTOR(S) : YOSHIHIRO TAKEMAE ET AL.

It is certified that error appears in the above-identified patent and that said Letters Patent is hereby corrected as shown below:

IN THE DRAWINGS

In FIG. 5, Add a connection dot at the intersection of the output from the gate of the transistor $Q_1$ connected to the transistor $Q_{10}$ and the connection line connecting the transistor $Q_6$ to the node $N_1$.

Add a connection dot at the intersection of the output from the gate of the transistor $Q_2$ connected to the transistor $Q_{11}$ and the connection line connecting the transistor $Q_7$ to the node $N_2$.

UNITED STATES PATENT AND TRADEMARK OFFICE
CERTIFICATE OF CORRECTION

PATENT NO. : 4,451,908

DATED : MAY 29, 1984

INVENTOR(S) : YOSHIHIRO TAKEMAE ET AL.

It is certified that error appears in the above-identified patent and that said Letters Patent is hereby corrected as shown below:

Col. 8, line 36, after "buffer," insert --operatively connected to receive an external address or internal refresh address,--;

line 39, delete "operatively connected to receive an external--;

line 40, delete "address or internal refresh address,".

Col. 10, line 12, change "an external address or internal" to --a trigger pulse--;

line 13, delete "refresh address";

line 17, change "said timing" to --an external--;

line 27, change "said external" to --an external--;

line 28, change "said internal" to --an internal--.

Signed and Sealed this

Thirteenth Day of March, 1990

*Attest:*

JEFFREY M. SAMUELS

*Attesting Officer*        *Acting Commissioner of Patents and Trademarks*